United States Patent
Naijo et al.

(10) Patent No.: US 7,914,197 B2
(45) Date of Patent: Mar. 29, 2011

(54) LIGHT GUIDE MEMBER, FLAT LIGHT SOURCE DEVICE, AND DISPLAY DEVICE

(75) Inventors: Shuichi Naijo, Chiba (JP); Koji Tokita, Chiba (JP)

(73) Assignee: Showa Denko K.K., Tokyo (JP)

( * ) Notice: Subject to any disclaimer, the term of this patent is extended or adjusted under 35 U.S.C. 154(b) by 326 days.

(21) Appl. No.: 12/158,073

(22) PCT Filed: Dec. 26, 2006

(86) PCT No.: PCT/JP2006/326345
§ 371 (c)(1), (2), (4) Date: Jun. 19, 2008

(87) PCT Pub. No.: WO2007/074932
PCT Pub. Date: Jul. 5, 2007

(65) Prior Publication Data
US 2009/0091920 A1    Apr. 9, 2009

Related U.S. Application Data

(60) Provisional application No. 60/755,792, filed on Jan. 4, 2006.

(30) Foreign Application Priority Data

Dec. 27, 2005  (JP) .................................. 2005-375906

(51) Int. Cl.
*F21V 7/04* (2006.01)
(52) U.S. Cl. ......... 362/627; 362/606; 362/607; 362/618
(58) Field of Classification Search .................. 362/231, 362/606–607, 618, 627
See application file for complete search history.

(56) References Cited

U.S. PATENT DOCUMENTS

2005/0046321 A1* 3/2005 Suga et al. ..................... 313/112
(Continued)

FOREIGN PATENT DOCUMENTS

EP    0 936 682 A1    8/1999
(Continued)

OTHER PUBLICATIONS

Hirokazu Shibata, Techno-Frontier Symposium 2005, Thermal Design and Countermeasure Technology Symposium, Apr. 20, 2005 (Japan Management Association), Session G3: Latest Design Case of Heat Radiation Mounting I, pp. G3-3-1 to G3-3-4.

*Primary Examiner* — Sandra L O Shea
*Assistant Examiner* — Meghan K Dunwiddie
(74) *Attorney, Agent, or Firm* — Sughrue Mion, PLLC

(57) ABSTRACT

A light guide member, a flat light source device and a display device using the light guide member. A plurality of luminescent devices that emit light of violet to blue color are arrayed on a substrate, and a light guide member is disposed upward thereof that includes a first area that consists of a transparent resin and composed of the resin independently, a second area in which there is dissolved in the resin a luminescent substance that generates a second color having a radiation peak wavelength at a wavelength different from a radiation peak wavelength of a luminescent device of the first color, and a third area in which there is dissolved in the resin a luminescent substance that generates a third color having a radiation peak wavelength at a wavelength different from the radiation peak wavelengths of luminescent devices of the first and second colors.

15 Claims, 7 Drawing Sheets

U.S. PATENT DOCUMENTS

| | | |
|---|---|---|
| 2005/0110923 A1* | 5/2005 | Yamashita et al. .......... 349/107 |
| 2005/0185113 A1 | 8/2005 | Weindorf et al. |
| 2006/0172148 A1 | 8/2006 | Murayama et al. |

FOREIGN PATENT DOCUMENTS

| | | |
|---|---|---|
| JP | 10-082915 A | 3/1998 |
| JP | 2732492 B2 | 3/1998 |
| JP | 2000-267606 A | 9/2000 |
| JP | 2004-055772 A | 2/2004 |
| JP | 2004-070193 A | 3/2004 |
| JP | 2004-071357 A | 3/2004 |
| JP | 3576541 B2 | 7/2004 |
| JP | 2005-008872 A | 1/2005 |
| WO | 2005/001331 A1 | 1/2005 |
| WO | 2005/065356 A2 | 7/2005 |

* cited by examiner

Fig. 2-A
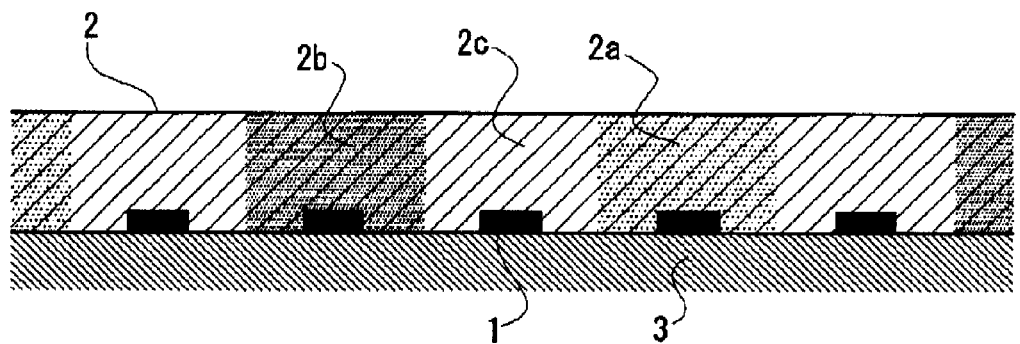
Fig. 2-B
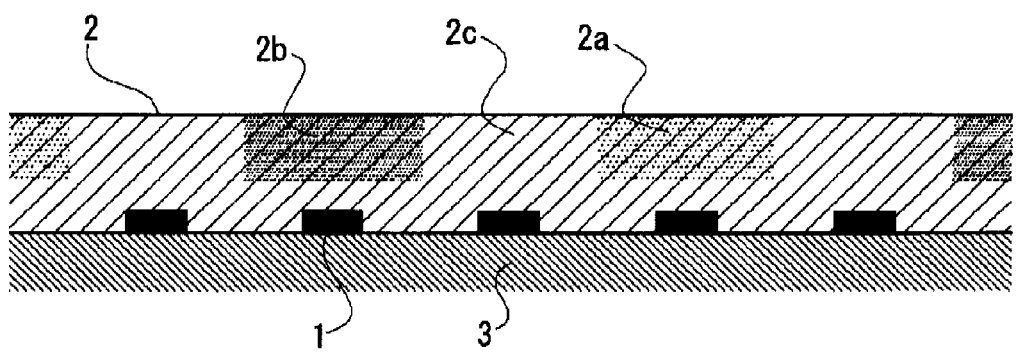
Fig. 2-C
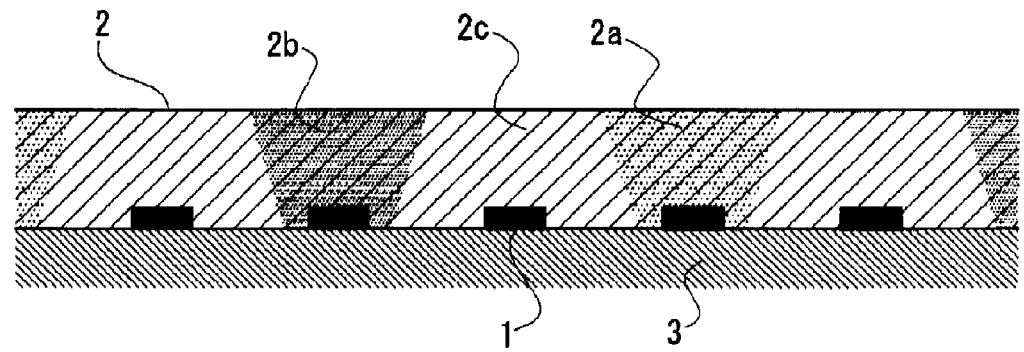

Fig. 2-D
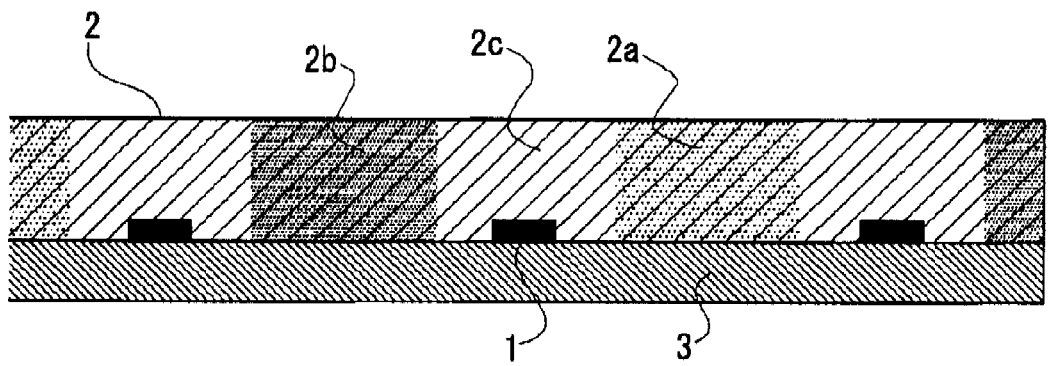
Fig. 2-E
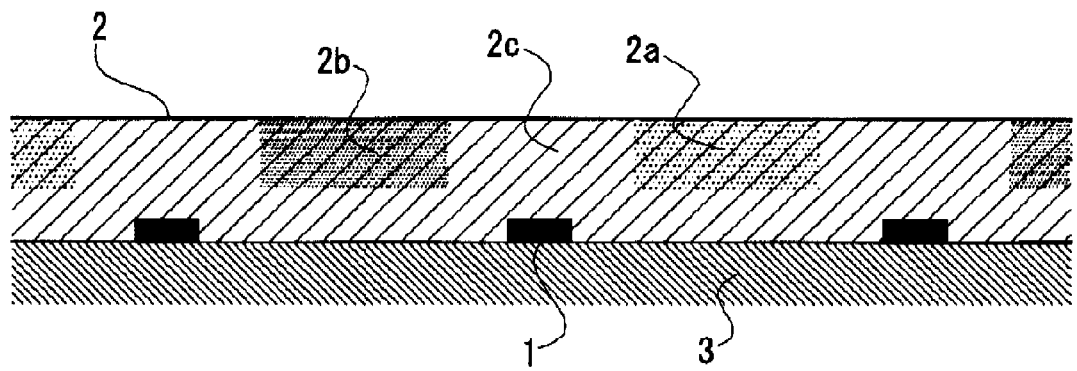
Fig. 2-F
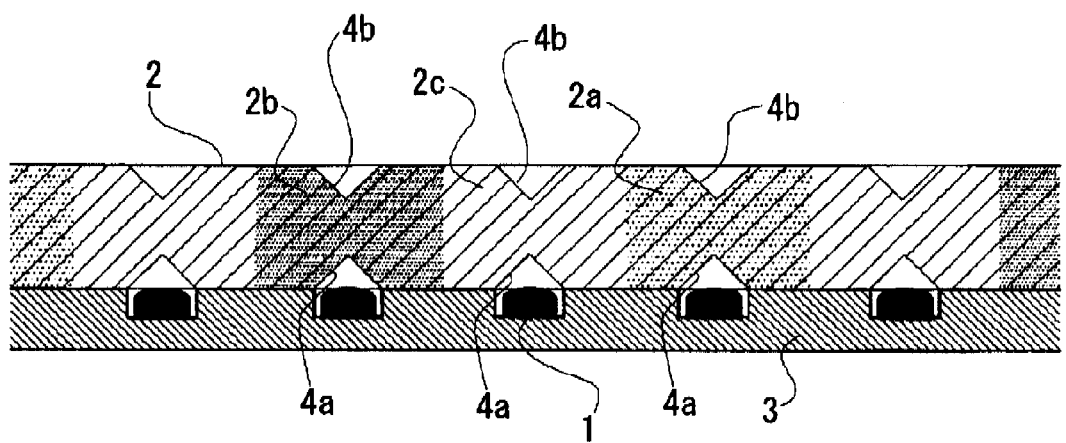

Fig. 3-A
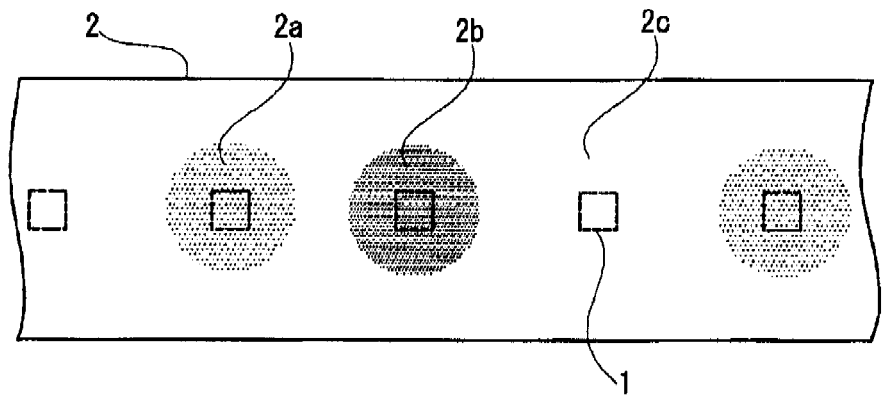
Fig. 3-B
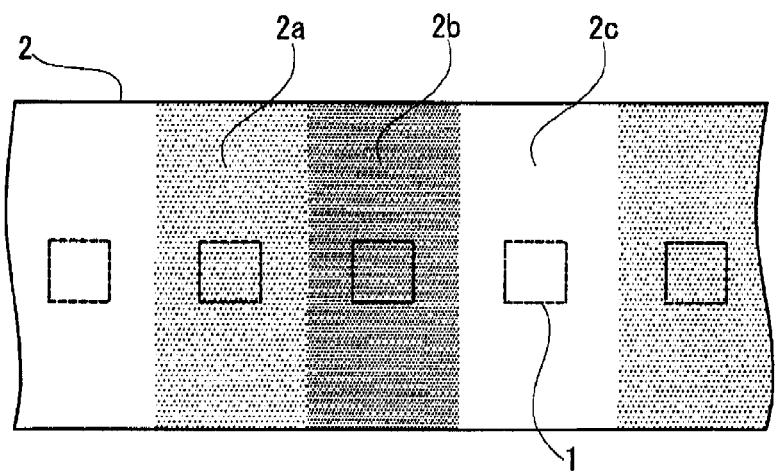
Fig. 3-C
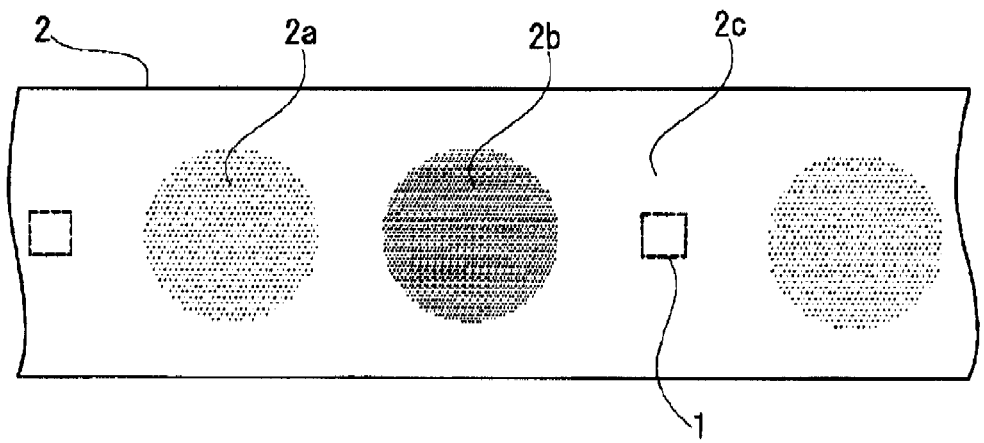

Fig. 3-D
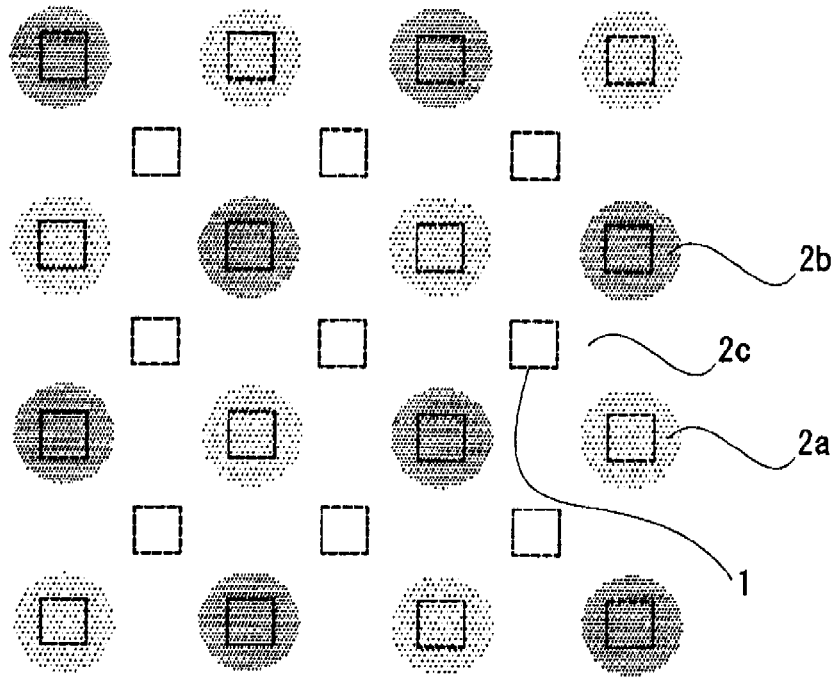
Fig. 3-E
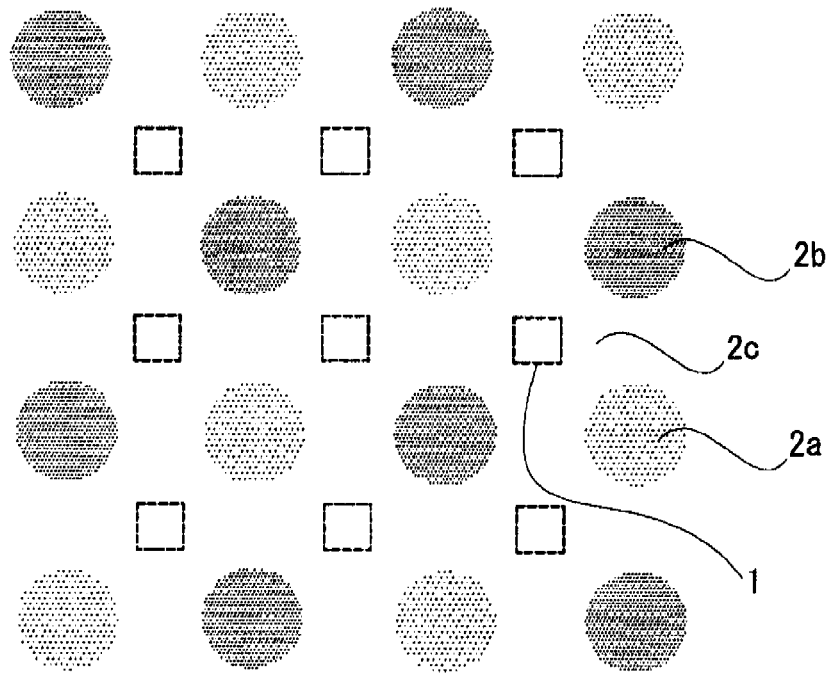

LIGHT GUIDE MEMBER, FLAT LIGHT SOURCE DEVICE, AND DISPLAY DEVICE

CROSS REFERENCES OF RELATED APPLICATION

This application is an application filed under 35 U.S.C. §111(a) claiming benefit pursuant to 35 U.S.C. §119(e)(1) of the filing date of Provisional Application 60/755,792 filed on Jan. 4, 2006 pursuant to 35 U.S.C. §111(b).

TECHNICAL FIELD

The present invention relates to a light guide member for a flat light source device, a flat light source device using the light guide member, and a display device provided with the flat light source device that are used as a back light for a liquid crystal display for instance.

BACKGROUND OF THE INVENTION

In recent years, a light emission efficiency of a light-emitting diode device has been extremely improved, and an application of the light-emitting diode device to an illumination is being progressed. In particular, in the case in which there is used a light emitting diode device as a back light for a liquid crystal display, a satisfactory gamut of reproducible colors and a high speed response can be implemented and it is expected that a high quality display be achieved (Japanese Patent Publication No. 3576541).

Conventionally, the main stream of such a back light for a liquid crystal display has been the so-called edge light type in which a cold cathode tube as a light source is disposed on the edge face of the chassis for thinning and low power consumption of the apparatus (Japanese Patent Publication No. 2732492). However, a demand of enlarging a liquid crystal display has been increased in recent years, and the edge light type has a limitation in improving a luminance and a uniformity in the luminance. Therefore, an adoption of a direct lighting type light has been examined for a large size liquid crystal display.

FIG. 5 is a cross sectional view for showing a configuration of a conventional planar light source device of a direct lighting type used in a liquid crystal display (TECHNO-FRONTIER SYMPOSIUM 2005, Thermal Design and Countermeasure Technology Symposium, Issue Date: Apr. 20, 2005 (Japan Management Association), Session G3: Latest Design Case of Heat Radiation Mounting I (pp. G3-3-1 to G3-3-4) and so on). The flat light source device 11 is disposed directly below a liquid crystal panel 21. In the flat light source device 11, LED light sources 1 using a light emitting diode device are disposed in an array pattern on a bottom face of a chassis 12, and the LED light sources 1 have a plurality of luminescent colors different from each other such as three colors of RGB. Moreover, the bottom face and side faces of the chassis 12 are covered with a reflecting sheet 13. Furthermore, over the LED light sources 1, a diffusing sheet 14 and a prism sheet 15 are disposed in the range of 1 to 5 cm in general apart from the LED light sources 1.

In the case in which a light is emitted from the LED light sources 1, the emitted light travels directly toward the diffusing sheet 14, or is reflected by the reflecting sheet 13 and travels toward the diffusing sheet 14. The emitted light is then irregularly reflected in the diffusing sheet 14, and is inclined in a vertical direction by passing through the prism sheet 15. The emitted light then enters a liquid crystal panel 21. Lights emitted from different LED light sources 1 are mixed in a space between the LED light sources and the diffusing sheet 14. The mixing is then improved by an irregular reflection in the diffusing sheet 14, thereby implementing a uniform luminance and a uniform chromaticity.

However, in the case in which a color mixture is carried out by using LED light sources of a plurality of colors such as RGB without using a monochromatic LED light source, a color mixture is insufficient and unevenness of colors may be found.

Moreover, in the case in which the diffusing sheet is made further apart from the LED light sources, unevenness of colors can be reduced to a certain level by a spatial color mixture. However, this method causes a thickness of a back light to be enlarged, and is not preferable for a flat panel display.

In the above described flat light source device of a direct lighting type, in order to further improve a uniform chromaticity and suppress a thickness of the flat light source device, it is effective to dispose a light guide plate that faces to LED light sources in front of a substrate in which a plurality of LED light sources is disposed and to dispose a reflecting layer on the back face of the light guide plate, thereby propagating and diffusing a light that has been emitted from each LED light source in a horizontal direction in the light guide plate and then extracting the light forward.

However, even in the case in which such a light guide plate is used, the disposed position of the LED light sources has a certain restriction in consideration of a heat radiation from an LED chip and a circuit design of a substrate on which an LED chip is disposed. Consequently, the relative positions of luminous origins of luminance colors different from each other such as RGB are restricted, thereby causing a sufficient color mixture to be restricted.

As described above, it is necessary to use LED light sources with a plurality of colors such as RGB in order to obtain a white flat light source such as a back light for a liquid crystal display. On the other hand, a means of obtaining a white color without a color mixture by LED light sources with a plurality of colors is thought to be using a white LED light source (Japanese Laid-Open Patent Publication No. 2004-55772 and Japanese Laid-Open Patent Publication No. 2004-70193). For a known conventional white LED light source, a resin layer in which the inorganic fluorescent material particles such as YAG-Ce have been dispersed is formed on the periphery of an LED bare chip that has been face-down bonded to a substrate, and, for instance, a blue light emitted from a blue LED bare chip is mixed to a yellow fluorescence emitted from the inorganic fluorescent material particles that has been excited by a light emitted from the blue LED bare chip, thereby emitting a white color light as a whole.

However, although a light emitted from the above white LED light source is visually white, a luminance characteristic in a visible light wave length area is not flat and a wavelength distribution of a luminance has a deflection. For a liquid crystal display, a color filter of RGB is disposed on a liquid crystal panel, and each color of RGB is extracted for every picture element through a color filter which a white light emitted from a white back light passes. However, for the above white LED light source, since a blue LED light and a yellow fluorescence is mixed to obtain a white color, a strength of a red color area that is on the longest wave side of a visible light wave length area is weaker than a strength of other wave length areas. Consequently, a color of a light that has passed through a red filter is unnatural and a color rendering property is not satisfactory.

As a fluorescent material of a conventional white LED light source, an inorganic particle is used as described above. However, in the case in which a resin plate in which such inorganic particles are dispersed is used for a light guide plate to which a sufficient light propagation property is required, the inorganic particle becomes a dispersion origin and prevents a light propagation in a horizontal direction, and the function of a light guide plate for diffusing lights emitted from each LED light source is lost.

The above light source in which an LED bare chip is combined with a fluorescent material of a single kind is not indicated to be applied to a light guide plate having functions for introducing lights emitted from each LED light source disposed on the back side into one plate having a light propagation property, for propagating and diffusing the lights in a horizontal direction in the plate, and for emitting the lights forward.

An object of the present invention is to provide a light guide member, a flat light source device using the light guide member, and a display device, by which a white light having a high color rendering property can be obtained without using luminescent devices of a plurality of colors.

DISCLOSURE OF THE INVENTION

The present invention involves the following modes (1) to (8).
(1) A light guide member that is made of a transparent resin and that is disposed on a substrate on which a luminescent device of a first color with a radiation peak wavelength in the range of 380 to 490 nm is mounted, for diffusing lights emitted from the luminescent device and guiding the lights upward, is characterized by comprising:
  a first area composed of the resin independently,
  a second area in which there is dissolved in the resin a luminescent substance that generates a second color having a radiation peak wavelength at a wavelength different from a radiation peak wavelength of a luminescent device of the first color by an excitation due to a light emitted from the luminescent device of the first color, and
  a third area in which there is dissolved in the resin a luminescent substance that generates a third color having a radiation peak wavelength at a wavelength different from the radiation peak wavelength of luminescent devices of the first and second colors by an excitation due to a light emitted from the luminescent device of the first color.
(2) A light guide member as defined in above (1) is characterized in that a radiation peak wavelength of the luminescent substance of the second color is in the range of 490 to 560 nm, and a radiation peak wavelength of the luminescent substance of the third color is 605 nm or longer.
(3) A flat light source device is characterized by comprising:
  the light guide member as defined in above (1) or (2), and
  the luminescent device of a first color with a radiation peak wavelength in the range of 380 to 490 nm.
(4) A flat light source device as defined in above (3) is characterized in that the luminescent device of a first color is disposed below each of the first, second, and third areas.
(5) A flat light source device as defined in above (3) is characterized in that the luminescent device of a first color is disposed below the first area.
(6) A flat light source device as defined in any one of above (3) to (5) is characterized in that the luminescent device is a light emitting diode.
(7) A display device is characterized by comprising the flat light source device as defined in any one of above (3) to (6).
(8) A display device as defined in above (7) is characterized in that a display portion is a liquid crystal panel.

For the above invention, the light guide member involves both types in which the luminescent device is disposed directly below the light guide member apart from the bottom face of the light guide member as shown in FIG. 2-F, and in which the luminescent device is integrated with (buried in) the inside portion at the bottom of the light guide member as shown in FIGS. 2-A to 2-E. The expression of disposing the luminescent device "below" the light guide member can be applied to the both types. In the latter case, for the light guide member and the luminescent device integrated with each other, the section from which the luminous device is excluded is a light guide member.

In the above invention, only a monochromatic luminescent device of one of the purple to blue colors is used as an light source. Moreover, areas of at least two kinds containing luminescent devices with radiation peak wavelengths different from each other, for instance, a green color luminescent area and a red color luminescent area, are formed in one light guide member.

As described above, since a luminescent substance that can be dissolved in a resin, for instance, an organic luminescent substance as described later, is used as a light source, the light guide member can ensure a sufficient transparency and a sufficient light propagation property even in the area containing the luminescent substance. The light guide member of the invention in which the organic luminescent substances are dissolved in a resin material is different from that in which inorganic particles are dispersed in a resin material.

Moreover, the area containing the luminescent substance has the both functions as a light source emitting a light other than the purple to blue color lights and as a light guide portion for propagating lights in a horizontal direction and for diffusing the lights.

More specifically, while the present invention uses only a monochromatic luminescent device as a light source, lights emitted from luminescent substances contained in the second and third areas of the light guide plate become dummy light sources of other colors on the longer wave side.

The second and third areas with luminescent colors different from each other and the first area that does not contain a luminescent substance except for the second and third areas are integrated with the light guide member. Consequently, a light of the first color of the purple to blue colors, which is guided from the luminescent device to the light guide member, and lights of the second and third colors emitted from the second and third areas in the light guide member, for instance, lights of other colors such as green and red, are propagated in a horizontal direction in the light guide member by a reflection at the upper and bottom faces of the light guide member. The lights are then diffused, mixed to each other, and extracted forward as white lights.

By the above configuration, the white lights extracted from a flat light source device include the purple to blue color lights emitted from luminescent devices and lights of other colors emitted from the second and third areas, such as green and red colors, thereby obtaining a flat luminance characteristic close to that of a natural light in a visible light wavelength area and obtaining a white light having a high color rendering property.

Moreover, the second and third areas in which a luminescent substance has been dissolved are excited and emit lights by a light that has been emitted from the luminescent device, that has entered the light guide member, and that has been propagated in a horizontal direction, even in the case in which the second and third areas are not disposed directly over the luminescent device. Therefore, the second and third areas as a dummy light source can be formed in a desired shape at a desired position in the light guide member. Consequently, as compared with the case in which luminescent devices with a plurality of colors are used, restrictions to the position of a light source are greatly reduced and it becomes easy to obtain a color mixture. As a result, unevenness of colors of white color lights emitted from the flat light source device can be reduced.

For a conventional back light in which each of LED light sources of RGB is disposed, it is actually impossible to arrange LEDs without gaps in consideration of a generated calorific value and a cost. Accordingly, since a distance between LED light sources of RGB becomes larger, a spatial distance is required to improve a color mixture and implement a uniform luminance, thereby increasing a thickness of a back light.

Against the above configuration, in the present invention, the second and third areas can be freely formed in a continuous or discrete manner in the light guide member regardless of the position and number of luminescent devices such as a blue LED light source. Consequently, the present invention is of great advantage to make a color of a light white and to thin a back light.

By the light guide member and the flat light source device related to the present invention, a white light having a high color rendering property can be obtained without using LED light sources of a plurality of colors.

By the display apparatus related to the present invention, a high quality image can be obtained since the display apparatus such as a liquid crystal display is configured with the above flat light source device as a back light.

BRIEF DESCRIPTION OF THE DRAWINGS

FIG. 2-A is a partial cross sectional view showing an embodiment of a flat light source device related to the present invention;

FIG. 2-B is a partial cross sectional view showing another embodiment of a planar light source device related to the present invention;

FIG. 2-C is a partial cross sectional view showing another embodiment of a flat light source device related to the present invention;

FIG. 2-D is a partial cross sectional view showing another embodiment of a flat light source device related to the present invention;

FIG. 2-E is a partial cross sectional view showing another embodiment of a flat light source device related to the present invention;

FIG. 2-F is a partial cross sectional view showing another embodiment of a flat light source device related to the present invention;

FIG. 3-A is a partial top view showing another embodiment of a flat light source device related to the present invention;

FIG. 3-B is a partial top view showing another embodiment of a flat light source device related to the present invention;

FIG. 3-C is a partial top view showing another embodiment of a flat light source device related to the present invention;

FIG. 3-D is a partial top view showing another embodiment of a flat light source device related to the present invention.

FIG. 3-E is a partial top view showing another embodiment of a flat light source device related to the present invention;

BEST MODE FOR CARRYING OUT THE INVENTION

An embodiment of the present invention will be described below in detail with reference to the drawings. In the present specification, while a light guide member side viewed from a substrate on which a luminescent device is disposed is called "upward" or "forward" in some cases, "upward" and "forward" are used as a matter of convenience for an explanation and the two words have the same meaning essentially. However, the present invention is not restricted to the embodiment.

Figure 1:
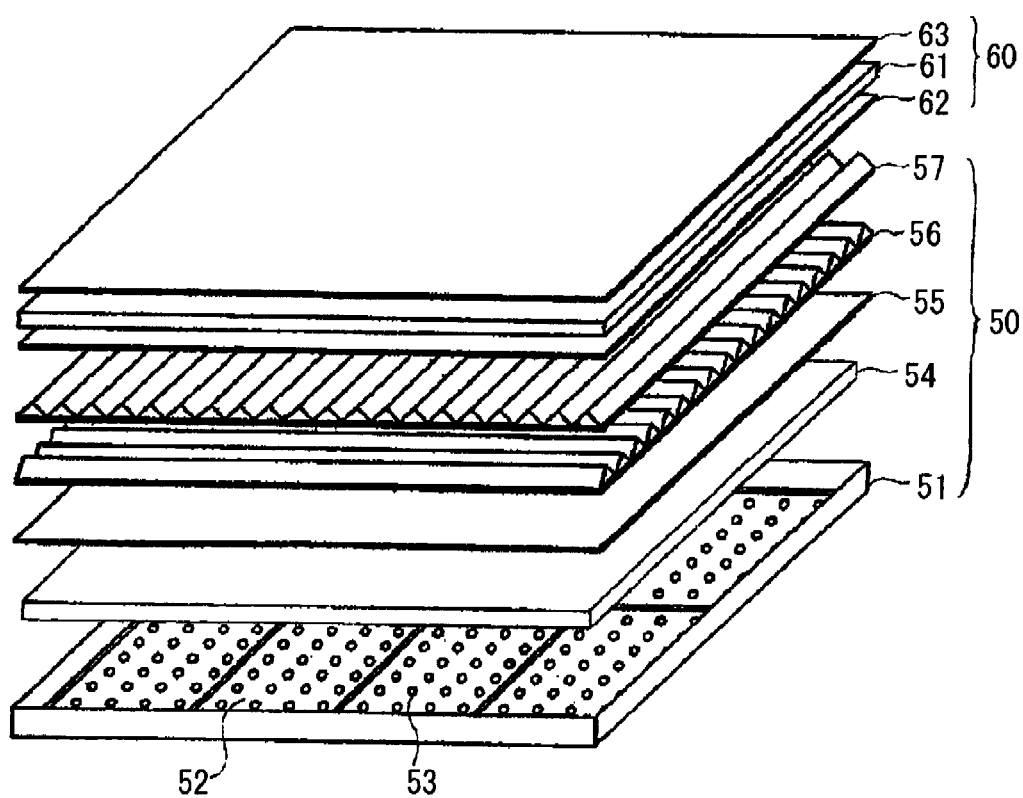
FIG. 1 is a view showing an entire configuration of an example of a liquid crystal display device to which an embodiment of the present invention is applied.

FIG. 1 is a view showing an entire configuration of an example of a liquid crystal display device to which an embodiment of the present invention is applied. A liquid crystal display device in which the embodiment is applied includes, as a flat light source device of a direct lighting type (back light) 50, a back light flame (chassis) 51 that accommodates a light emitting part and an LED substrate (mounting substrate) 52 as a substrate in which a plurality of light emitting diodes (LED) 53, which is a solid-state lighting device, are arranged as light sources.

Further, on the LED substrate (mounting substrate) 52, the back light device 50 includes a light guide member 54 which is a feature of the present invention, and which is accommodated in the back light flame (chassis) 51.

The difference from a conventional direct lighting type back light device as shown in FIG. 1 lies in that the light guide member interposes in a space between the light emitting diodes and the diffusing sheet, thereby enabling to shorten an interval between the light emitting diodes and the diffusing sheet without increasing a thickness of the back light.

On the light guide member, as a laminate of optical compensation sheets, it is equipped with a diffusing sheet 55 that diffuses and scatters a light to render a uniform brightness to the entire surface, and prism sheets 56, 57 that are grating films which exhibit a light collection effect to the forward direction.

Also, as a liquid crystal display module 60, it is equipped with a liquid crystal panel 61 in which a liquid crystal is sandwiched between two glass substrates, and polarizing plates (polarizing filters) 62, 63 for restricting a vibration of a light wave to a certain direction.

Further, the liquid display device is arranged with peripheral members, e.g., a driver LSI (not shown).

The liquid crystal panel 61 is constituted with including many kinds of components that are not shown in the figure. For instance, it is equipped with a display electrode, an active device such as a TFT (Thin Film Transistor), and a liquid crystal, a spacer, a sealing agent, an alignment film, a common electrode, a protection film, a color filter, etc., which are not shown, on or between the two glass substrates.

FIGS. 2-A to 2-F are partially cross sectional views showing an embodiment of a flat light source device related to the present invention, and FIGS. 3-A to 3-E are partial top views showing an embodiment of a flat light source device related to the present invention. The flat light source device related to the present embodiment is used as a white back light of a liquid crystal display.

As shown in FIGS. 2-A to 2-F, in a flat light source device related to those embodiments, a plurality of LED light sources 1 for emitting a blue light is disposed on upper face side of a substrate 3.

There is disposed a light guide member 2 of which a base material is a resin capable of propagating a light on a plurality of the LED light sources 1. Inside the light guide member 2, there are formed a plurality of green color luminescent areas 2a containing an organic luminescent substance of which a radiation peak wavelength is in the range of 490 to 560 nm (the above second areas), and a plurality of red color luminescent areas 2b containing an organic luminescent substance of which a luminescent wave length peak is 605 nm or longer (the above third areas).

In the embodiments shown in FIGS. 2-A to 2-C, the LED light sources 1 are disposed below the resin independent areas 2c that do not contain an organic luminescent substance of the light guide member 2 (the above first areas), below the green color luminescent areas 2a, and below the red color luminescent areas 2b.

Lights emitted from the LED light sources 1 disposed below the resin independent areas 2c that do not contain an organic luminescent substance of the light guide member 2 enter the light guide member 2, and a part of the lights is propagated in a horizontal direction while repeating a reflection at the upper and bottom faces.

Lights emitted from the LED light sources 1 disposed below the green color luminescent areas 2a enter the light guide member 2, and a part of the lights excites the organic luminescent substances contained in the green color luminescent areas 2a to generate a green color. A part of the green lights is propagated in a horizontal direction while repeating a reflection at the upper and bottom faces of the light guide member 2.

Lights emitted from the LED light sources 1 disposed below the red color luminescent areas 2b enter the light guide member 2, and a part of the lights excites the organic luminescent substances contained in the red color luminescent areas 2b to generate a red color. A part of the red lights is propagated in a horizontal direction while repeating a reflection at the upper and bottom faces of the light guide member 2.

There are diffused the blue lights emitted from the LED light sources 1, the green lights generated in the green color luminescent areas 2a, and the red lights generated in the red color luminescent areas 2b by propagation in a horizontal direction in the light guide member 2. As a result, a white light in which the above colors have been mixed is emitted from the front face of the light guide member 2.

In the embodiments shown in FIGS. 2-D and 2-E, the LED light sources 1 are not disposed below the green color luminescent areas 2a and below the red color luminescent areas 2b, and the LED light sources 1 are disposed only below the resin independent areas 2c that do not contain an organic luminescent substance.

In the above embodiments, lights emitted from the LED light sources 1 enter the light guide member 2, and a part of the lights is propagated in a horizontal direction while repeating a reflection at the upper and bottom faces. A part of the propagated lights then enters the green color luminescent areas 2a, and excites the organic luminescent substances contained in the green color luminescent areas 2a to generate a green color. A part of the green lights is propagated in a horizontal direction while repeating a reflection at the upper and bottom faces of the light guide member 2.

Moreover, lights emitted from the LED light sources 1 enter the light guide member 2, and a part of the lights propagated in a horizontal direction then enters the red color luminescent areas 2b, and excites the organic luminescent substances contained in the red color luminescent areas 2b to generate a red color. A part of the red lights is propagated in a horizontal direction while repeating a reflection at the upper and bottom faces of the light guide member 2.

There are diffused the blue lights emitted from the LED light sources 1, the green lights generated in the green color luminescent areas 2a, and the red lights generated in the red color luminescent areas 2b by propagation in a horizontal direction in the light guide member 2. As a result, a white light in which the above colors have been mixed is emitted from the front face of the light guide member 2.

While the specified embodiments have been illustrated above, the flat light source device related to the present invention is provided with a plurality of luminescent devices of which a radiation peak wavelength is in the range of 380 to 490 nm and a light guide member disposed thereon.

The luminescent devices such as LED light sources are arrayed on the substrate apart from each other linearly as shown in FIGS. 3-A to 3-C, or in an array pattern as shown in FIGS. 3-D and 3-E. The LED light source is provided with, for instance, a light emitting diode device with a size in the range of several hundreds μm to 1 mm. As a specified type of the LED light source, there are mentioned a bare chip type, a type in which a light emitting diode device is mounted in a package, a type in which a light emitting diode device is integrated with a member having a lens function, and so on.

As a substrate on which LED light sources are disposed, there is mentioned, for instance, a substrate in which a circuit is formed for supplying a current to an LED light source or a laminate of a circuit substrate and a radiating substrate. An anode and a cathode of the LED light source are electrically connected to an electrode pad on the circuit substrate. As a method of obtaining the circuit substrate, there is mentioned, for instance, a method of bonding a copper foil to an insulating resin substrate such as a glass epoxy substrate and etching the copper foil in a circuit pattern.

The heat radiating substrate is a substrate made of a material with a high thermal conductivity, such as a metal such as aluminum, copper, and a stainless steel, or a ceramics such as aluminum nitride. By bonding the radiating substrate to the back face of the circuit substrate, a heat generated from a light emitting diode device is radiated.

As a method of fixing an LED light source onto the substrate, there is mentioned, for instance, a method of a connection by using a connecting means with a small thermal resistance, such as a method of forming a through hole at the section in which an LED light source is mounted in the circuit substrate and of bonding the LED light source onto the radiating substrate exposed to the through hole by using a silver paste or a thermal conductivity silicone, and a method of thermally melting a metal such as a lead solder and a gold-tin eutectic solder and connecting the anode and cathode of a bare chip with the electrode pad of the circuit substrate by means of a face down bonding through a bump.

In the present invention, the light guide member is a member in a plate (sheet) shape made of a transparent material capable of propagating a light, and preferably is formed by a resin as a base material. A thickness of the light guide member is, for instance, in the range of 0.2 to 20 mm.

The light guide member is provided with the first to third areas inside. For those areas, the first area is made of the resin independently. In the second area, there is dissolved in the resin a luminescent substance that generates a second color having a radiation peak wavelength at a wavelength different from a radiation peak wavelength of a luminescent device of the first color by an excitation due to a light emitted from the luminescent device of the first color.

In the third area, there is dissolved in the resin a luminescent substance that generates a third color having a luminous wave length peak at a wave length different from the radiation peak wavelengths of luminescent devices of the first and second colors by an excitation due to a light emitted from the luminescent device of the first color.

In preferable modes related to the present invention, as shown in embodiments of FIGS. 2-A to 2-F, the second area is a green color luminescent area and the third area is a red color luminescent area. The green color luminescent area contains an organic luminescent substance that mainly emits a light of a green wavelength area by a light emitted from a luminescent device, and the red color luminescent area contains an organic luminescent substance that mainly emits a light of a red wavelength area by a light emitted from a luminescent device.

The organic luminescent substance contained in the green color luminescent area preferably has a wide absorption edge extending to a blue wavelength area on the long wave side and a luminescent peak at a wavelength in the range of 490 to 560 nm, and is excited by a light emitted from a luminescent device to emit a fluorescence or a phosphorescence.

The organic luminescent substance contained in the red color luminescent area preferably has a wide absorption edge extending to a blue wavelength area on the long wave side and a luminescent peak at a wave length of 605 nm or longer, and is excited by a light emitted from a luminescent device to emit a fluorescence or a phosphorescence.

In a light guide member, there is improved a mixture of a light of which the main component is a blue color emitted from the luminescent device, a light of which the main component is a green color emitted from the green color luminescent area, and a light of which the main component is a red color emitted from the red color luminescent area. The mixture of the three primary colors enables a white color to be emitted from the flat light source device.

As a mode for emitting a white color from the flat light source device, in addition to the above combination of R, G, and B, a white color can also be obtained by properly selecting an organic luminescent substance to be contained in the second and third areas to emit a yellow light and an orange light from the areas, and by mixing the lights with the purple to blue lights emitted from the luminescent device. As such a example, there is mentioned a combination of a green color from the second area and an orange color from the third area.

In the present invention, the organic luminescent substance is used as a base material of the light guide member. For instance, the organic luminescent substance can be dissolved in a resin such as an epoxy resin and an acrylic resin, and has an absorption band in a wavelength area of ultraviolet or blue and a luminescent peak on the longer wave side. As a specified example, there is mentioned a transition metal complex and a rare earth metal complex of which a ligand is an organic molecule having a nitrogen-included heterocyclic structure.

As a ligand that is used for the metal complexes as described above, there are mentioned acetylacetonato, 2,2'-bipyridine, 4,4'-dimethyl-2,2'-bipyridine, 1,10-phenanthroline, 2-phenylpyridine, porphyrin, phthalocyanine, pyrimidine, quinoline, isoquinoline, and a derivative thereof. For the ligands, ligands of one or plural kinds are coordinated for one complex.

For the organic luminescent substances as described above, as a specified example in which an intensity distribution of a fluorescence has a peak in a wave length area of a green color, there is mentioned an iridium complex indicated by the following formula (I).

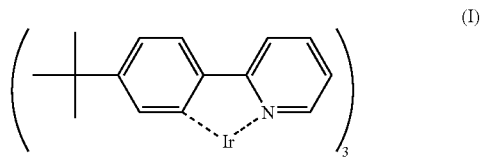

Moreover, as a specified example in which an intensity distribution of a fluorescence has a peak in a wave length area of a red color, there is mentioned an iridium complex indicated by the following formula (II).

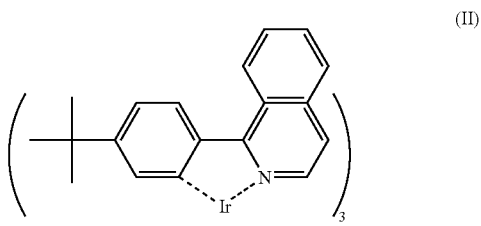

The above organic luminous substance can be dissolved in a resin that is the base material of a light guide member, and even a small amount to be used enables a high wavelength conversion efficiency to be obtained.

Moreover, the organic luminescent substance has the configuration described in Japanese Laid-Open Patent Publication No. 2003-77675, that is, a nonionic exited site is a part of a polymer or is combined with a polymer, and the luminous portion is formed by constraining metal atoms at one or more portions of the polymer. The organic luminescent substance that emits phosphorescence from an excitation triplet state can also be used. As a specified example, there is mentioned a coordinate linkage formed by a metal atom such as iridium and a nitrogen atom such as a pyridine structure, a pyrimidine structure, and a quinoline structure on the polymer side.

The light guide member with which the first to third areas have been integrated can be fabricated, for instance, by using a transparent resin as a base material, preparing a plate member in which a depression, a through hole, or a groove has been formed at the section in which the second and third areas are to be formed, and injecting a resin solution in which the organic luminescent substance has been dissolved into the depression or the like, and hardening the resin solution. Moreover, the light guide plate can also be fabricated by fabricating a resin pellet in which the organic luminescent substance has been dissolved, and fitting the resin pellet into a depression formed in a separate transparent plate, or injecting a resin solution in a frame in which a plurality of resin pellets have been arranged, and hardening the resin solution.

The second and third areas can be formed in any shape at any position of the light guide member if necessary. The disposed position of the second and third areas can be a position other than the section over the luminescent device as described above. Even in such a case, a light emitted from the luminescent device can enter the light guide member, be propagated in a horizontal direction in the light guide member by a reflection, reach the second and third areas, and excite and emit an organic luminescent substance.

The second and third areas can be formed in such a manner that the section containing the organic luminescent substance leads from the upper face to the bottom face as shown in FIGS. 2-A and 2-D, or in such a manner that the section containing the organic luminescent substance is not the entire section in a thickness direction but a part in a thickness direction as shown in FIGS. 2-B and 2-E. The peripheral shape of the second and third areas can also be a shape other than a vertical face in a thickness direction of the light guide member, for instance, a shape having an angle in a thickness direction of the light guide member as shown in FIG. 2-C. Moreover, a shape of the second and third areas in a plane direction of the light guide member can be any shape such as a circular shape as shown in FIG. 3-A and a rectangular shape as shown in FIG. 3-B.

FIGS. 3-A and 3-B illustrate an example in which LED light sources 1 are arranged linearly in series and the LED light sources 1 are disposed below the green color luminescent areas 2a, the red color luminescent areas 2b, and the resin independent areas 2c in the light guide member 2, and FIG. 3-C illustrates an example in which LED light sources 1 are arranged linearly in series and the LED light sources 1 are disposed only below the resin independent areas 2c in the light guide member 2. Moreover, FIG. 3-D illustrates an example in which LED light sources 1 are arranged in an array-like manner and the LED light sources 1 are disposed below the green color luminescent areas 2a, the red color luminescent areas 2b, and the resin independent areas 2c in the light guide member 2, and FIG. 3-E illustrates an example in which LED light sources 1 are arranged in an array pattern and the LED light sources 1 are disposed only below the resin independent areas 2c in the light guide member 2.

The arrangement of the first to third areas in the light guide member 2 is properly determined in consideration of the disposition of the luminescent devices such as LED light sources in such a manner that unevenness of colors become less and a flat luminance characteristic can be obtained in consideration of a color rendering property. For instance, the first to third areas are disposed in such a manner that a unit arrangement composed of one point of R, one point of G, and one point of B as a unit; of one point of R, two points of G, and one point of B as a unit; or of two points of R, two points of G, and one point of B as a unit, is regularly formed in the light guide member. For instance, in the case in which an arrangement of two points of R, two points of G, and one point of B that are linearly disposed is a unit, there are arranged a red color luminescent area, a green color luminescent area, a resin independent area, a green color luminescent area, and a red color luminescent area in this order in the light guide member.

As shown in FIG. 2-F, a depression 4a can be formed at a position directly over a luminous device such as an LED light source 1 on the back face of the light guide member 2. In addition, a depression 4b can also be formed at a position directly over a luminescent device such as an LED light source 1 or at a position between the positions directly over a luminescent device on the front face of the light guide member 2. A shape of the depressions 4a and 4b is, for instance, a circular cone, a pyramid, a circular cylinder, a prism, or a hemi-sphere.

As described above, the depression 4a is formed at the position directly over the luminescent device, over which a luminance of the light guide member is highest, thereby suppressing an unevenness of luminance caused by a higher luminance of the light guide member at the position in front of the luminescent device. Consequently, a uniformity of a luminance distribution can be improved on the light emitting face of the light guide member.

Moreover, the depression 4b is also formed on the front face of the light guide member 2, thereby improving a uniformity of a luminance distribution on the light emitting face of the light guide member.

In the present invention, a light scattering dot can be formed on the front face and the back face of the light guide member in order to improve a uniformity of a luminance if necessary. The light scattering dot can be formed by the dot printing of a scattering ink or the integral molding with the light guide member.

In the present invention, a reflecting part can be disposed on the back face of the light guide member if necessary. As an example of such a reflecting part, there are mentioned a white reflecting sheet bonded to the back face of the light guide member, a film of a white paint printed on the back face of the light guide member, and a white reflecting layer formed on the circuit substrate.

In front of the light guide member in front of the luminous device such as an LED light source disposed on the substrate, a diffusing sheet is preferably disposed a distance in the range of 1 to 5 cm apart preferably. For instance, the luminescent devices such as LED light sources are disposed on the bottom of the chassis in which the bottom face and the side face are covered with a reflecting sheet, and a diffusing sheet is disposed on the upper face side of the chassis.

Figure 4:
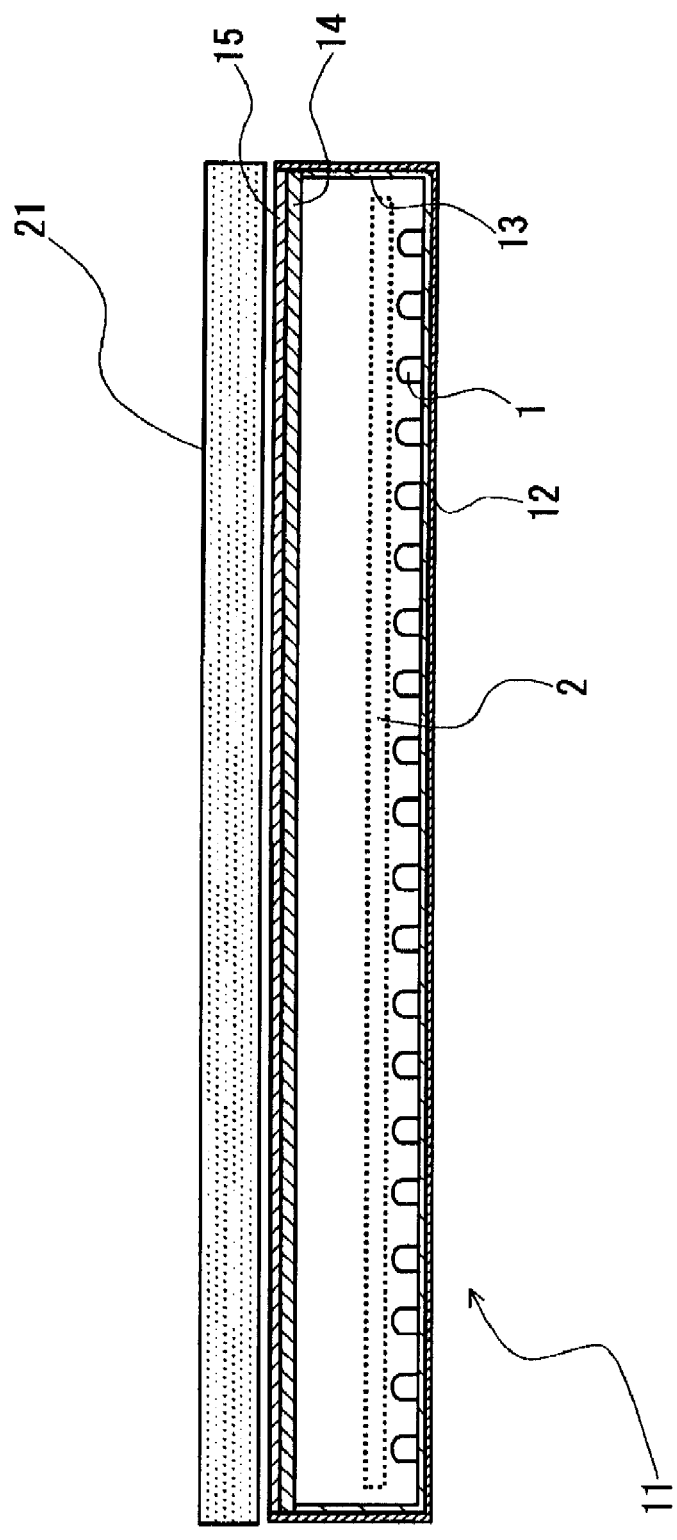
FIG. 4 is a cross sectional view showing an entire configuration of a flat light source device related to an embodiment of the present invention.
Figure 5:
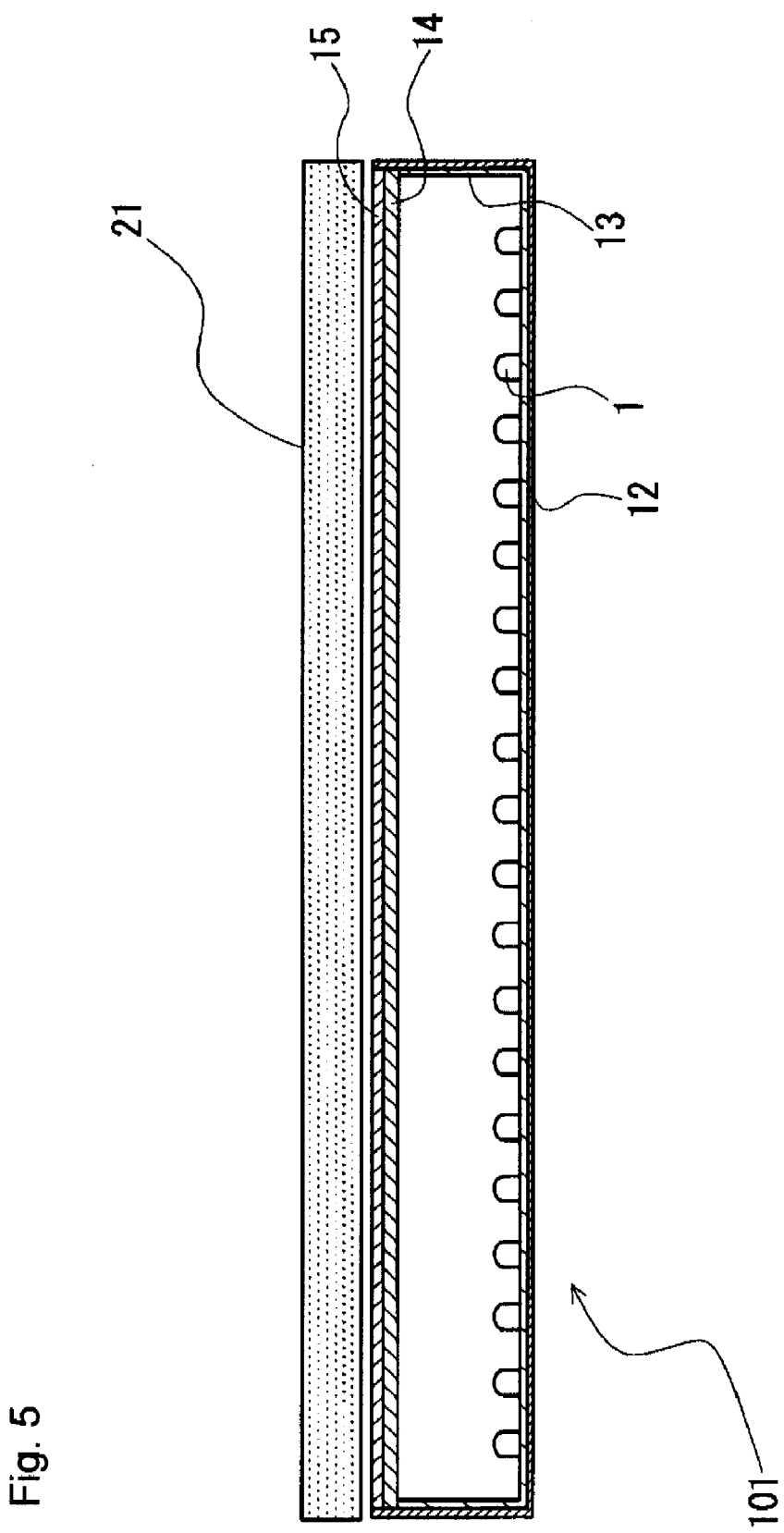
FIG. 5 is a cross sectional view for showing a configuration of a conventional flat light source device of a direct lighting type used in a liquid crystal display.

FIG. 4 shows the entire configuration of a flat light source device related to an embodiment of the present invention. The flat light source device 11 is configured similarly to the prior art shown in FIG. 5 except that there is used only a monochromatic LED light source that is a luminescent device of the first color and that a light guide member 2 is disposed. The flat light source device 11 is disposed directly below a liquid crystal panel 21. In the flat light source device 11, LED light sources 1 are disposed in an array-like manner on a bottom face of a chassis 12, and the bottom face and side faces of the chassis 12 are covered with a reflecting sheet 13. Moreover, the light guide member 2 is disposed over the LED light sources 1, and over the light guide member 2, a diffusing sheet 14 and a prism sheet 15 are disposed in the range of 1 to 5 cm in general apart from the LED light sources 1.

The display apparatus related to the present invention is provided with the flat light source device as described above. Typically, a display portion of the display device is a liquid crystal panel, and the flat light source device is disposed on the back face of the liquid crystal panel as a back light as shown in FIG. 4.

EXAMPLES

While the detailed examples of the present invention will be described below, the present invention is not restricted to the examples.

Example 1

An iridium complex of 8 mg of the above described formula (II) was dissolved in the epoxy resin (product name: NLD-SL-1101 manufactured by SANYU REC CO. LTD.) of 10 g and degassed. The iridium complex was then filled in a metal mold made of an aluminum alloy capable of fabricating a cylindrical pellet with a diameter of 6 mm and a thickness of 1 mm, and heated at 100° C. for two hours and then at 130° C. for three hours to fabricate a pellet capable of emitting a red light.

Similarly, a pellet capable of emitting a green light was fabricated by using an iridium complex of 30 mg of the above described formula (I) and an epoxy resin of 10 g. Moreover, a pellet made of only an epoxy resin without containing an iridium complex was also fabricated.

A white insulating layer with a thickness of 40 µm was then formed on a square aluminum base plate with a side of 50 mm and with a thickness of 1 mm. Moreover, four blue LED bare chip illuminants of a gallium nitride type with a total radiant flux of 70 mW, a peak wave length of 455 nm, and longitudinal and transverse sides of a 1 mm size were arranged linearly at a 10 mm pitch, and four lines of the arrangement were disposed in parallel at a 10 mm pitch.

Moreover, blue LED bare chip light sources were also disposed at the middle positions between adjacent lines and at the positions 5 mm shifted upward and downward from the line connecting adjacent light sources. Consequently, there was fabricated a substrate capable of lighting 25 blue LED bare chip light sources as the entire substrate.

An LED driving wiring pattern on the substrate can independently drive in parallel the four lines of four serial driving and the three lines of three serial driving.

The above substrate was buried in an iron frame with inside dimensions of longitudinal 50 mm×transverse 50 mm and a height of 3 mm, in which Teflon (registered trademark) processing was carried out to the surface. The sealing up was then carried out to the bottom of the form to prevent a sealing resin from flowing out from a bottom gap, and the epoxy resin (product name: NLD-SL-1101 manufactured by SANYU REC CO. LTD.) was filled in the form up to the whole form (a height from the upper face of the substrate is approximately 2 mm). Then, there was set on the form a cover in a plate shape in which a cylindrical protrusion with a diameter of 6.1 mm and a height of 1 mm was formed at the position corresponding to each light source on the above blue LED bare chip light source substrate that is a substrate with dimensions of longitudinal 60 mm×transverse 60 mm and a thickness of 1 mm, in which Teflon (registered trademark) processing was carried out to the surface. The heating at 100° C. for two hours and then at 130° C. for three hours was carried out to obtain a substrate in which there was formed an epoxy resin layer with a thickness of 2 mm provided with a depression with a depth of 1 mm.

Subsequently, a pellet capable of emitting a red light and a pellet capable of emitting a green light were fitted into the epoxy resin depressions on the line on which four blue LED chip light sources were arranged in series in such a manner that the pellets were disposed by turns.

A pellet made of only an epoxy resin containing no iridium complex was fitted onto a line on which three blue LED chip light sources were arranged in series, and there was fabricated finally a planar light source device of a type of FIG. 2-B and corresponding to FIG. 3-D.

As the fitting of a pellet, there was adopted a method of coating a small amount of epoxy resins (equivalent to an epoxy resin that was used in the pellet fabrication) on the bottom and side faces of the pellet in order to prevent a decrease in an amount of transmitted lights due to a generation of a gap layer between the depression and the pellet, and of heating the pellet at 130° C. for five hours after being fitted.

Example 2

A circular washer made of polypropylene with an outer diameter of 6 mm and a thickness of 2 mm having a hole with an inner diameter of 5 mm, in which an adhesive double coated tape of a polypropylene type was bonded to the rear face, was bonded to the periphery of each blue LED bare chip light source on the substrate capable of lighting 25 light sources fabricated in Example 1 in such a manner that the center of the illuminant corresponds to the center of the washer hole.

An unhardened resin solution capable of emitting a red light was made by dissolving an iridium complex of 4 mg of the above described formula (II) into the epoxy resin (product name: NLD-SL-1101 manufactured by SANYU REC CO. LTD.) of 10 g and degassing. Moreover, an unhardened resin solution capable of emitting a green light was made by dissolving and degassing an iridium complex of 15 mg of the above described formula (I) into the epoxy resin of 10 g. The above unhardened resin solutions and an unhardened resin solution made of only an epoxy resin without containing an iridium complex were supplied up to a height of approximately 2 mm in the washer hole by using a dispenser apparatus. The heating at 130° C. for five hours was carried out to form a red color luminescent area, a green color luminescent area, and a resin independent area in a cylindrical shape with a diameter of 5 mm and a height of 2 mm over the blue LED bare chip light sources. The arrangement of the above areas is equivalent to that on the substrate fabricated in Example 1.

Subsequently, after removing the washer, similarly to Example 1, the above substrate was buried in an iron frame with inside dimensions of longitudinal 50 mm×transverse 50 mm and a height of 3 mm, in which Teflon (registered trademark) processing was carried out to the surface. The sealing up was then carried out to the bottom of the frame to prevent a sealing resin from flowing out from a bottom gap, and the epoxy resin was filled in the frame up to the whole frame (a height from the upper face of the substrate is approximately 2 mm). The heating at 130° C. for five hours was carried out to obtain a substrate in which an epoxy transparent resin was buried in areas other than the above cylindrical areas.

Example 3

Each of the substrates fabricated in Examples 1 and 2 was disposed and fixed to an aluminum chassis with a front face opened with a bottom face of longitudinal 60 mm×transverse 60 mm and with a depth of 30 mm. A reflecting layer in which white reflecting films (product name: Lumirror 60L (registered trademark) manufactured by Toray Industries, Inc.) were bonded to each other was formed on the inside faces of the chassis except for the opening portion.

Moreover, a diffusing sheet (polycarbonate, product name: PC9391-50HL manufactured by TEIJIN CHEMICALS LTD.) was fixed to the front face of the opening portion of the aluminum chassis to fabricate a planar light source device corresponding to FIGS. 3-D and 4.

For the flat light source device, a current of 220 mA was applied to the series line of four LEDs over which the red color luminescent area and the green color luminescent area were formed, a current of 60 mA was applied to the series line of three LEDs over which the resin independent area made of only an epoxy resin was formed, and a total average luminance and a chromaticity coordinate on the diffusing sheet were measured by the calorimeter (product name: CS1000 manufactured by Konica Minolta, Inc.). Moreover, there were measured a dispersion of a luminance ([(maximum luminance−minimum luminance)/average luminance]×100%) and a dispersion of the chromaticity coordinate (a difference in the maximum value and the minimum value of chromaticity coordinates X and Y) in the case in which a circular area with a diameter of 10 mm was measured at the 5 mm pitch on the diagonal line from the center position of the diffusing sheet. The measured results are listed in Table 1.

Example 4

For the flat light source device of Example 3 fabricated using the substrates fabricated in Examples 1 and 2, no current was applied to the series line of four LEDs over which the red color luminescent area and the green color luminescent area were formed, a current of 250 mA was applied to the series line of three LEDs over which the resin independent area made of only an epoxy resin was formed, and a total average luminance and a chromaticity coordinate on the diffusing sheet were measured by the calorimeter (product name: CS1000 manufactured by Konica Minolta, Inc.). Moreover, there were measured a dispersion of a luminance ([(maximum luminance−minimum luminance)/average luminance]×100%) and a dispersion of the chromaticity coordinate (a difference of the maximum value from the minimum value of chromaticity coordinates X and Y) in the case in which a circular area with a diameter of 10 mm was measured at the 5 mm pitch on the diagonal line from the center position of the diffusing sheet.

More specifically, the red color luminescent area and the green color luminescent area were not excited for a light emission by the blue LED bare chip light sources thereunder, but were excited for a light emission by a light propagated in the epoxy resin from a near blue LED bare chip light source. Consequently, this configuration corresponds to that of FIG. 3-E. The measured results are listed in Table 1.

TABLE 1

|  | Average luminance (cd/m$^2$) | Luminance dispersion (%) | Average chromaticity (X, Y) | Chromaticity dispersion (ΔX, ΔY) |
| --- | --- | --- | --- | --- |
| Example 3 (substrate of Example 1) | 16000 | 9 | (0.29, 0.29) | (0.008, 0.009) |
| Example 3 (substrate of Example 2) | 21000 | 13 | (0.29, 0.29) | (0.013, 0.018) |
| Example 4 (substrate of Example 1) | 4800 | 22 | (0.22, 0.25) | (0.031, 0.025) |
| Example 4 (substrate of Example 2) | 3700 | 27 | (0.21, 0.24) | (0.039, 0.030) |

The invention claimed is:

1. A light guide member that is made of a transparent resin and that is disposed in abutting contact on a substrate on which a luminescent device which generates light of a first color with a radiation peak wavelength in the range of 380 to 490 nm is mounted in abutting contact, for diffusing lights emitted from the luminescent device and guiding the lights upward, the light guide member comprising:
   a first area composed of the resin which has no luminescent substance dissolved therein,
   a second area in which there is dissolved in the resin a luminescent substance that generates light of a second color by an excitation due to the light of the first color emitted from the luminescent device, wherein the light of the second color has a radiation peak wavelength at a wavelength different from the radiation peak wavelength of the first color, and
   a third area in which there is dissolved in the resin a luminescent substance that generates light of a third color by an excitation due to the light of the first color emitted from the luminescent device, wherein the light of the third color has a radiation peak wavelength at a wavelength different from the radiation peak wavelength of the first and second colors.

2. A light guide member as defined in claim 1, wherein a radiation peak wavelength of the luminescent substance of the second color is in the range of 490 to 560 nm, and a radiation peak wavelength of the luminescent substance of the third color is 605 nm or longer.

3. A flat light source device comprising:
   the light guide member as defined in claim 1, and
   the luminescent device of a first color with a radiation peak wavelength in the range of 380 to 490 nm.

4. A flat light source device as defined in claim 3, wherein the luminescent device of a first color is disposed below each of the first, second, and third areas.

5. A flat light source device as defined in claim 3, wherein the luminescent device of a first color is disposed below the first area.

6. A flat light source device as defined in claim 3, wherein the luminescent device is a light emitting diode.

7. A display device comprising the flat light source device as defined in claim 3.

8. A display device as defined in claim 7, wherein a display portion is a liquid crystal panel.

9. A light guide member as defined in claim 1, wherein the light guide member is disposed between the substrate and a diffusing sheet such that the light guide member directly abuts both the substrate and the diffusion sheet.

10. A light guide member as defined in claim 1, wherein the luminescent device is a monochromatic light source.

11. A light guide member as defined in claim 1, wherein the substrate includes a plurality of luminescent devices, including the luminescent device, mounted in abutting contact on the substrate, and each of the plurality of luminescent devices is disposed directly beneath the light guide member and are monochromatic lights sources which emit light of the first color with the radiation peak wavelength in the range of 380 to 490 nm.

12. A light guide member as defined in claim 1, wherein the luminescent substance of the second area generates the light of the second color in response to being excited by the light of the first color, and the luminescent substance of the third area generates the light of the third color in response to being excited by the light of the first color.

13. A light guide member as defined in claim 1, wherein the first area emits the light of the first color generated from the luminescent device, the second area emits light of the second color generated from the luminescent substance of the second area, and the third area emits light of the third color generated from the luminescent substance of the third area.

14. A light guide member as defined in claim 1, wherein the light guide member, including the first, second and third areas, is a one-piece integral construction.

15. A light guide member as defined in claim 1, the luminescent substance of the second area comprises a first metal complex and has an absorption band in a wavelength area of 380 to 490 nm, and the luminescent substance of the third area comprises a second metal complex and has an absorption band in the wavelength area of 380 to 490 nm.

* * * * *